United States Patent
Iwaasa

(10) Patent No.: US 7,771,226 B2
(45) Date of Patent: Aug. 10, 2010

(54) STRUCTURE FOR LEADING OUT POWER CODE OF ELECTRIC APPARATUS

(75) Inventor: Hiroaki Iwaasa, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 12/172,055

(22) Filed: Jul. 11, 2008

(65) Prior Publication Data

US 2009/0017672 A1 Jan. 15, 2009

(30) Foreign Application Priority Data

Jul. 11, 2007 (JP) .............................. 2007-181664

(51) Int. Cl.
*H01R 13/58* (2006.01)
(52) U.S. Cl. ................................... 439/460
(58) Field of Classification Search ................ 439/460, 439/554, 535, 901, 915, 76.2, 446, 212, 464, 439/472, 473, 949, 892, 466, 658, 506, 359, 439/372; 174/59, 72 A, 480, 66, 68.1, 72 C, 174/72 R
See application file for complete search history.

(56) References Cited

U.S. PATENT DOCUMENTS

| | | | | |
|---|---|---|---|---|
| 5,731,763 A | * | 3/1998 | Herweck et al. | 340/825.69 |
| 6,527,581 B1 | * | 3/2003 | Wang | 439/445 |
| 7,422,443 B2 | * | 9/2008 | Kaneko et al. | 439/76.2 |
| 2005/0186834 A1 | | 8/2005 | Tanikawa et al. | |
| 2007/0167073 A1 | * | 7/2007 | Tsai | 439/554 |

FOREIGN PATENT DOCUMENTS

| | | |
|---|---|---|
| JP | 2002-134950 | 5/2002 |
| JP | 2002-319773 | 10/2002 |
| JP | 2005-327809 | 11/2005 |
| JP | 3128387 | 12/2006 |
| WO | 2006/016464 | 2/2006 |

OTHER PUBLICATIONS

European Search Report for Application No. 08012625.3 mailed Mar. 24, 2010, 7 pages.
Patent Abstracts of Japan for application with Publication No. 2005327809, Publication Date: Nov. 24, 2005, 1 page.

* cited by examiner

*Primary Examiner*—Edwin A. Leon
(74) *Attorney, Agent, or Firm*—Osha • Liang LLP

(57) ABSTRACT

A structure for leading out a power code extended from a wiring board on which electronic components of an electronic apparatus are mounted, the structure includes: a first housing, accommodating the wiring board, and comprised of resin; a second housing, accommodating the first housing, and formed with an opening communicating an external space of the electronic apparatus; a regulating member, hanging up the power cord above the wiring board and guiding the power cord to the opening, and being monolithic with the first cover.

4 Claims, 2 Drawing Sheets

STRUCTURE FOR LEADING OUT POWER CODE OF ELECTRIC APPARATUS

BACKGROUND

1. Field of the Invention

The present invention relates to a power cord extraction part structure of an electric apparatus, and more particularly, in an electric apparatus in which an electric circuit unit applied with high voltage is accommodated in a casing made of sheet metal, to a power cord extraction port structure of the electric apparatus in which the power circuit unit is covered with an integrally formed protective cover made of resin to extend the linear distance (interval) or a creepage distance from the casing to tall components or soldered portions of the power circuit unit, thereby improving safety or electric properties.

2. Description of the Related Art

In recent years, in an electric apparatus such as a DVD drive, thinning and flattening of a casing of the electric apparatus have remarkably been promoted. Moreover, in case of the casing made of sheet metal, it is demanded to ensure safety or electric properties by securing a distance between a top plate, a bottom plate or side plates constituting an outer plate of the casing and a power circuit unit accommodated in the casing to be sufficiently large or lengthening a creepage distance between the top plate, bottom plate or side plates of the casing and the power circuit unit, thereby securing safety in use and electric properties.

In order to meet the above-described demand, there are provided various measurements in which a height dimension of tall components is made as low as possible to enlarge or secure a distance between the power circuit unit and the top plate of the casing or the like, thereby improving safety or electric properties, or an insulating sheet is attached to a rear surface of the top plate of the casing to ensure safety in use or electric properties.

However, in an electric apparatus in which a top plate, a bottom plate or side plates of a casing is made of sheet metal, when the tall components such as capacitors having small height dimensions are used as a measurement to attempt thinning and flattening of the casing while securing safety in use and electric properties, the tall components are expensive to let the cost high. Furthermore, in case of employing the measurement in which an insulating sheet is attached to a rear surface of the top plate of the casing or the like, required safety or electric properties cannot be maintained when the insulating sheet is removed.

Therefore, the inventors have repeatedly and intensively studied to sufficiently ensure electric insulation between the top plate of the thinned and flattened casing and the power circuit unit without using expensive tall components having low heights. As a result, it has been found that by covering the power circuit unit with the integrally formed protective cover made of resin, the top plate of the thinned and flattened casing or the like is prevented from contacting the tall components such as capacitors by the protective cover so that electric insulation between the casing and the power circuit unit is sufficiently ensured, as disclosed in Japanese Utility Model Registration No. 3,128,387. The protective cover disclosed in Japanese Utility Model Registration No. 3,128,387 is provided in an inner corner portion of the casing made of sheet metal, and includes an upper plate interposed between the top plate of the casing and the power circuit unit, a lower plate disposed at a lower side of wirings of the power circuit unit, and a rear plate interposed between an back plate of the casing and the power circuit units.

Meanwhile, there is a suggestion that in order to prevent an AC cord from contacting a chassis of the casing made of an iron plate, a drawn portion of the AC cord in the casing is held in place by a wire holding member, as disclosed in Japanese Patent Publication No. 2002-319773A. Furthermore, there is a suggestion for a structure of fixing a power cord in the case where the power cord is extracted to a rear side of a casing, as disclosed in Japanese Patent Publication No. 2002-134950A.

However, the electric apparatus in which the protective cover is provided as described in Japanese Utility Model Registration No. 3,128,387 generally employs the configuration in which the power cord connected to the wiring board of the power circuit unit is inserted into a power cord extraction port formed in a back plate of an outer plate of the casing to be extracted to the outside of the casing. Therefore, under the situation in which a drawn portion in the casing formed from a front end of the power cord connected to the wiring board to an extraction start end inserted through the power cord extraction port is positioned at a side portion of the protective cover, since the drawn portion of the power cord in the casing faces a confronting space between the upper plate and the lower plate of the protective cover, the drawn portion in the casing enters the confronting space, and thus may contact the electric components of the power circuit unit. When such contact occurs, the safety may not be ensured.

Accordingly, a configuration in which the drawn portion of the power cord in the casing is held by a wire holding member disclosed in Japanese Patent Publication No. 2002-319773A may be taken into consideration. However, in such case, there is a problem in that the wire holding member is excessively required and the number of necessary components is increased to increase fabricating processes, thereby decreasing mass productivity in a fabricating line or raising the cost. Furthermore, a configuration in which a double coated cord or the like subjected to high insulating treatment is used as the power cord may be taken into consideration. However, there is also a problem in that such a power cord itself is expensive to cause the increase in cost of the electric apparatus.

SUMMARY

It is therefore one advantageous aspect of the invention to provide a structure for leading out a power code extended from a wiring board on which electronic components of an electronic apparatus are mounted, the structure including: a first housing, accommodating the wiring board, and comprised of resin; a second housing, accommodating the first housing, and formed with an opening communicating an external space of the electronic apparatus; a regulating member, hanging up the power cord above the wiring board and guiding the power cord to the opening, and being monolithic with the first cover.

According to the above, the power cord is regulated so as not to contact the electric components so that the electronic apparatus is protected from a damage which is caused by contact between the power cord and the electric components. Furthermore, since the regulating member is comprised of resin and monolithic with the first housing which is made of resin and covers the wiring board, addition of the regulating member does not increase the number of necessary components.

Besides, the first housing may have a recess portion serving as a part of the regulating member through which the power cord is guided to the opening. Further, the opening may be located below a position where the regulating member hangs up the power cord.

According to the above, a part of the power cord is accommodated in the recess portion so that positional regulation operation of the regulating member for the power cord is securely exhibited.

According to the above, in an electric apparatus in which a linear distance or a creepage distance between the power circuit unit and the casing is enlarged by the protective cover to improve safety or electric properties, the drawn portion of the power cord in the casing which is connected to the wiring board and drawn out of the casing is prevented from contacting the electric components of the power circuit unit to decrease safety without adding excessive components such as a wire holding member or using expensive power cords such as a double coated cord. As a result, a user can use an electric apparatus having high safety at low cost.

BRIEF DESCRIPTION OF THE DRAWINGS

Embodiment may be described in detail with reference to the accompanying drawings, in which.

DETAILED DESCRIPTION OF THE INVENTION

Figure 1:
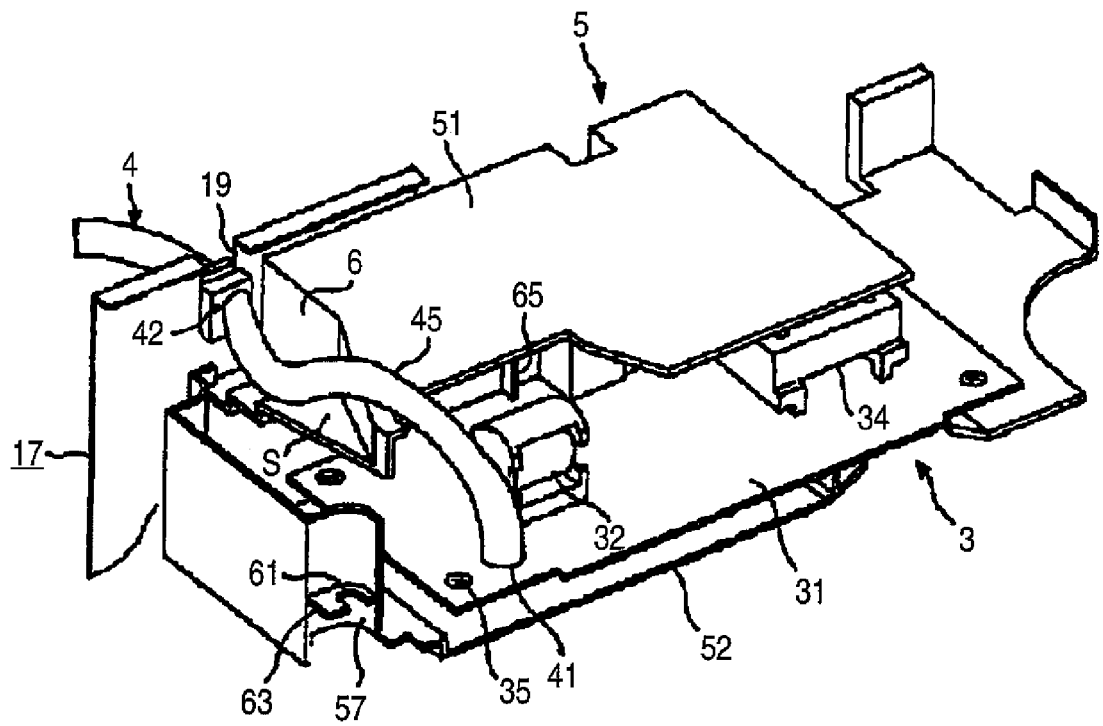
FIG. 1 is a schematic perspective view illustrating a power cord extraction part structure according to an embodiment of the invention.
Figure 2:
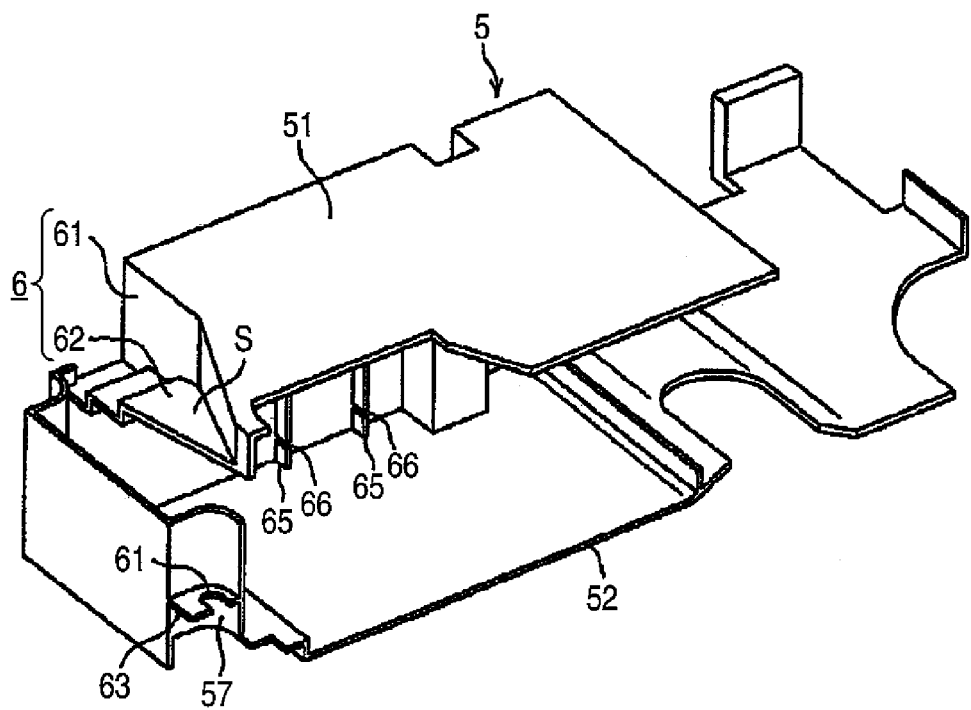
FIG. 2 is a schematic perspective view illustrating a protective cover integrally having a position regulating piece when seen obliquely from the front.
Figure 3:
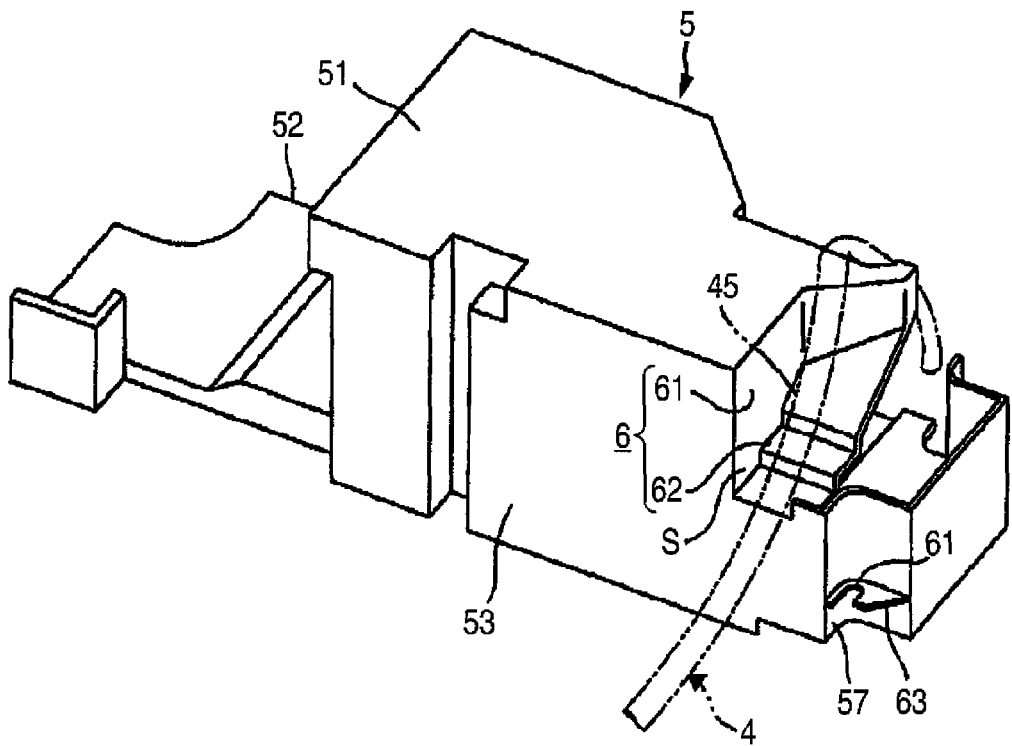
FIG. 3 is a schematic perspective view illustrating a protective cover when seen obliquely from the rear.
Figure 4:
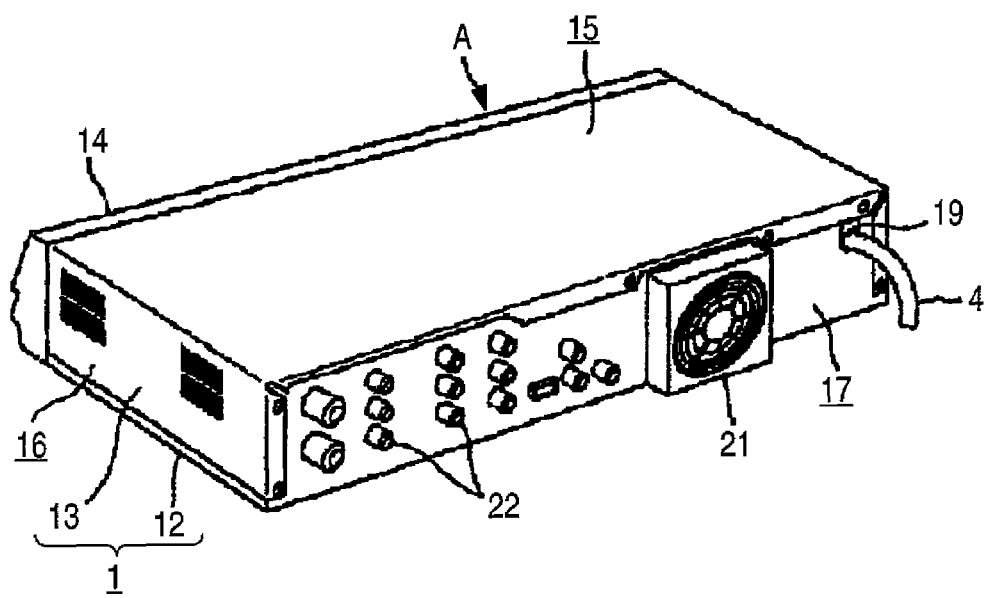
FIG. 4 is an appearance perspective view of an electric apparatus employing the power cord extraction part structure according to the invention when seen from the rear side.

FIG. 1 is a schematic perspective view illustrating a power cord extraction part structure according to an embodiment of the invention. FIG. 2 is a schematic perspective view illustrating a protective cover 5 integrally having a position regulating piece 6 when seen obliquely from the front. FIG. 3 is a schematic perspective view illustrating the protective cover 5 when seen obliquely from the rear. FIG. 4 is an appearance perspective view of an electric apparatus as a DVD drive employing the power cord extraction part structure according to the invention when seen from the rear side.

As shown in FIG. 4, the electric apparatus A includes a DVD drive main body and other necessary elements (not shown) in a flat thin casing 1, and the elements includes one power circuit unit which is described below. The casing 1 includes a bottom cover 12 made of sheet metal and a top cover 13 made of sheet metal which are assembled into a flat box shape, and a front panel 14 made of resin which is provided in a front end of the bottom cover 12 and the top cover 13. A top plate 15 of the casing 1 is formed by a top plate of the top cover 13, and left and right side plates 16 of the casing 1 are formed by a mating structure of side plates of the top cover 13 and the bottom cover 12. A back plate 17 of the casing 1 is formed by a back plate of the bottom cover 12, and a bottom plate (not shown) of the casing 1 is formed by a bottom plate of the bottom cover 12. Reference numeral 21 denotes a fan and 22 denotes a terminal group.

As shown in FIG. 1, a power circuit unit 3 includes a wiring board 31 as a power board on which a line filter 32 and a transformer 34 as electric components, and a capacitor and a radiator plate as tall components (not shown) are mounted. The line filter 32 and the transformer 34 are included in a primary circuit and the capacitor and the like are included in a primary power circuit. The power circuit unit 3 is fixed to the bottom plate of the casing 1 by means of a plurality of mounting screws 35, and is provided in an inner corner portion formed by being surrounded by the top plate 15 (see FIG. 1), the bottom plate, one side plate 16 (see FIG. 1) and the back plate 17 of the casing 1. A power cord 4 connected to the wiring board 31 of the power circuit unit 3 is drawn inside the casing 1 and inserted through an power cord extraction port 19 formed in the back plate 17 of the casing 1 to be extracted to the outside of the casing 1 (see FIG. 1).

The power circuit unit 3 is provided with a protective cover 5 which is integrally formed with resin, as shown in FIGS. 2 and 3. The protective cover 5 includes a flat upper plate portion 51, a flat rectangular lower plate portion 52 which is thinner and longer than the upper plate portion 51, and an erecting plate portion 53 extending between the lower plate portion 52 and the upper plate portion 51. The upper plate portion 51, the lower plate portion 52 and the erecting plate portion 53 form substantially a U-shape in side view. Inner corner portions 57 and 57 (shown in FIGS. 1 and 3) extending in a height direction are formed in predetermined places of the protective cover 5, and screw fixing pieces 63 and 63 having a mounting screw insertion holes 61 and 61 are integrally formed in the inner corner portions 57 and 57. As shown in FIG. 2, vertical ribs 65 are formed at a plurality of places at a predetermined interval on the inner surface of the erecting plate portion 53, and the edge of the wiring board 31 can be inserted into groove portions 66 which are formed by cutting the middle portions of vertical ribs 65 in a height direction. Accordingly, in the protective cover 5, the vertical ribs 65 which each include the groove portion 66 function as a wiring board holder.

As shown in FIG. 1, the protective cover 5 is provided to cover the wiring board 31 and primary electric components such as the electric component mounted on the wiring board 31. In other words, before the wiring board 31 is screw-fixed to the bottom plate 18 of the casing 1, the wiring board 31 is inserted into a facing space where the upper plate portion 51 and the lower plate portion 52 of the protective cover 5 are faced with each other, so that electric connection portions between the primary electric component or the electric components and the wiring board are provided in the facing space. Subsequently, the wiring board 31 is screw-fixed to the bottom plate of the casing 1 and the screw fixing pieces 63 and 63 of the protective cover 5 shown in FIGS. 2 and 3 are fixed to the casing 1 using mounting screws (not shown).

In this way, when the wiring board 31 or the protective cover 5 is fixed to the casing 1, a rear edge of the wiring board 31 is inserted into the groove portions 66 of the vertical ribs 65 of the protective cover 5. Accordingly, the protective cover 5 and the wiring board 31 are positioned in a thickness direction of the wiring board 31. Therefore, even though vibration or falling impact is generated, interference between the electric component and the protective cover 5 does not occur.

When the protective cover 5 where the power circuit unit 3 is inserted in the casing 1 is provided like the above description, thinning or flattening the casing 1 can be devised by approaching the location of the top plate 15 of the casing 1 toward the electric components of the power circuit unit 3 as close as possible. Even in this case, the upper plate portion 51 of the protective cover 5 is interposed between the top plate 15 of the casing 1 and top portions of the capacitor, which is the tallest component among the electric components, and the lower plate portion 52 of the protective cover 5 is interposed between the bottom plate of the casing 1 and the electric connection portions (soldered portions). Accordingly, even though the casing 1 is curved by an external force, a situation in which the top plate 15 or the bottom plate 18 directly contacts the electric components or the electric connection portions is prevented by the upper plate portion 51 or the lower plate portion 52 of the protective cover 5, and a situation in which a user gets shocked due to a short accident between the casing 1 and the electric components or the electric connection portions does not occur. Accordingly, safety of the electronic apparatus is increased. The above-described short preventing influence of the upper plate portion 51 and the lower plate portion 52 of the protective cover 5 is also exerted by the erecting plate portion 53 and the like of the protective cover 5. That is, the erecting plate portion 53 helps to prevent the back plate 17 of the casing 1 from contacting the electric components.

Since the protective cover 5 is interposed between the casing 1 and the power circuit unit 3, the protective cover 5 enlarges a creepage distance between the casing 1 and the power circuit unit 3, thereby helping to improve electric properties of the electric apparatus.

In the electric code extraction part structure according to this embodiment, as shown in FIG. 1, the position of a drawn portion 45 in the casing formed from a front end 41 of the power cord 4 connected to the wiring board 31 to an extraction start end 42 inserted through the power cord extraction port 19 is regulated by the position regulating piece 6 made of a resin and integrally formed with the above-described protective cover 5 so as not to contact the electric component of the power circuit unit 3. As shown in FIGS. 2 and 3, the position regulating piece 6 is formed in an inner corner shape by a suspending piece 61 suspended from a side end of the upper plate portion 51 of the protective cover 5 and a siding piece 62 protruding from a lower end of the suspending piece 61 outside the protective cover 5 at a right angle. In addition, as shown in FIGS. 1 and 3, the drawn portion 45 of the power cord 4 in the casing is accommodated in an inner corner place S of the position regulating piece 6.

When the position of the drawn portion 45 of the power cord 4 in the casing is regulated by the position regulating piece 6 so as not to contact the electric components such as a capacitor of the power circuit unit 3, there occurs no situation in which the drawn portion 45 in the casing is inserted into the confronting space between the upper plate portion 51 and the lower plate portion 52 of the protective cover 5. Accordingly, the power cord 5 does not contact the electric components of the power circuit unit 3, thereby improving safety.

Since the position regulating piece 6 is made of a resin and integrally formed with the protective cover 5 made of a resin with which the power circuit unit 3 is covered, addition of the position regulating piece 6 does not increase the number of necessary components. Accordingly, mass productivity in a fabricating line does not decrease.

In this embodiment, the configuration in which the position regulating piece 6 extends from the side end of the upper plate portion 51 of the protective cover 5 has been described. However, the position regulating piece 6 may be provided at a location where the position regulating piece 6 does not interfere the electric components of the power circuit unit 3 does not occur, in consideration of the shape of the protective cover 5 which changes depending on the configuration of the power circuit unit 3.

What is claimed is:

1. A structure for leading out a power cord extended from a wiring board on which a power supply circuit of an electric apparatus is mounted, the structure comprising:

a first housing configured to accommodate the wiring board, the first housing being comprised of resin and monolithically formed with a regulating member configured to hang up a first portion of the power cord above the wiring board when the first housing accommodates the wiring board; and a second housing having a face exposed to an outside of the electric apparatus and formed with an opening configured to allow the power cord to pass through to the outside when the first housing accommodates the wiring board, wherein the first portion of the power cord is disposed between an outer face of the first housing and the opening when the first housing accommodates the wiring board.

2. The structure according to claim 1, wherein the regulating member is a recess formed on the first housing; and the opening is located below the highest position of the regulating member.

3. An electric apparatus, comprising:

a wiring board;

a power supply circuit mounted on the wiring board;

a power cord electrically connected to and extending from the wiring board;

a first housing accommodating the wiring board, the first housing being comprised of resin and monolithically formed with a regulating member hanging up a first portion of the power cord above the wiring board; and a second housing having a face exposed to an outside of the electric apparatus and formed with an opening allowing the power cord to pass through to the outside, wherein the first portion of the power cord is disposed between an outer face of the first housing and the opening.

4. The electric apparatus according to claim 3, wherein:

the regulating member is a recess formed on the first housing; and the opening is located below the highest position of the regulating member.

* * * * *